United States Patent [19]

Hernández

[11] Patent Number: 4,675,597

[45] Date of Patent: Jun. 23, 1987

[54] CIRCUIT ANALYZER FOR MEASURING PULSE REPETITION RATE AND PULSE WIDTH

[75] Inventor: Eduardo F. D. Hernández, Havana, Cuba

[73] Assignee: Instituto Nacional de Sistemas Automatizados Y'Techicas de Computacion, Havana, Cuba

[21] Appl. No.: 814,167

[22] Filed: Dec. 23, 1985

Related U.S. Application Data

[63] Continuation of Ser. No. 507,069, Jun. 23, 1983, abandoned.

[30] Foreign Application Priority Data

Jul. 26, 1982 [CS] Czechoslovakia ............... 5655-82

[51] Int. Cl.⁴ .................. G01R 23/02; G01R 15/12; G01R 31/28; H03K 5/22
[52] U.S. Cl. ............................ 324/73 R; 307/234; 324/78 D; 324/133; 328/109; 328/111
[58] Field of Search ............... 324/73 R, 133, 78 D, 324/79 D; 307/234, 510, 518; 328/109, 110, 111, 112, 129.1; 377/19, 20

[56] References Cited

U.S. PATENT DOCUMENTS

| | | | |
|---|---|---|---|
| 3,116,448 | 12/1963 | Vogel | 328/129.1 X |
| 3,487,317 | 12/1969 | Gowan | 307/518 |
| 3,619,775 | 11/1971 | Naylor et al. | 324/133 X |
| 4,011,447 | 3/1977 | Henderson | 377/20 |
| 4,112,358 | 9/1978 | Ashida | 324/79 D X |
| 4,139,819 | 2/1979 | Worley | 324/79 D |
| 4,152,639 | 5/1979 | Chaffee | 324/149 X |
| 4,356,442 | 10/1982 | Beha | 324/149 X |
| 4,424,482 | 1/1984 | Drogin | 324/79 D |

OTHER PUBLICATIONS

Czechlewski et al; Pulse and Level Detector Circuit; Western Electric Tech. Digest, No. 35, Jul. 1974, pp. 11-13.

Primary Examiner—Gerard R. Strecker
Attorney, Agent, or Firm—Lackenbach Siegel Marzullo & Aronson

[57] ABSTRACT

A circuit analyzer includes a time base generator and a counter driven by pulses of the generator for the measurement of pulse width. The generator is responsive to leading and trailing edges of a pulse for measurement of the pulse width. A selector circuit selects a single pulse from pulse burst. Transitions in logic state and continuity are displayed simultaneously with the pulse-width measurement.

4 Claims, 1 Drawing Figure

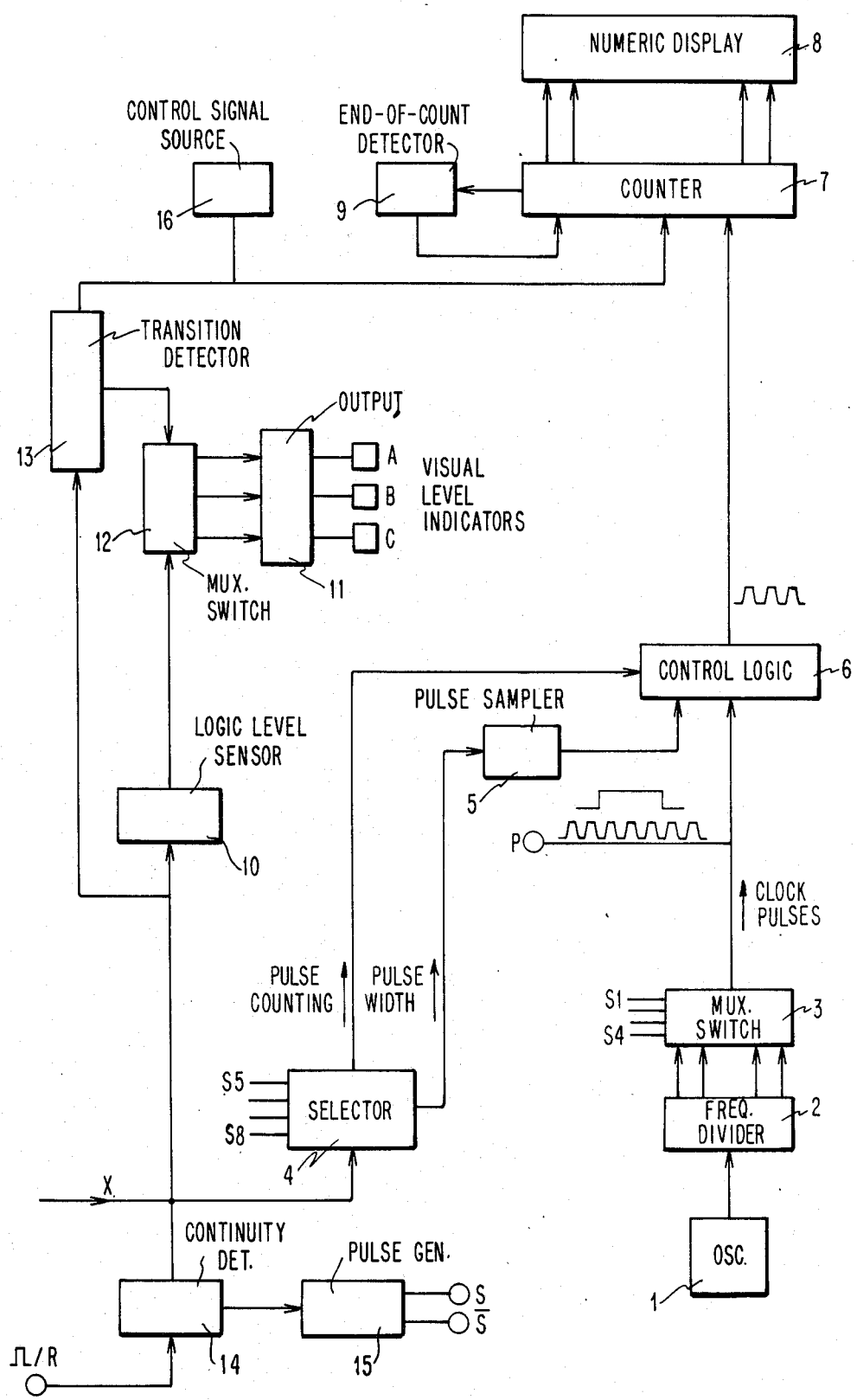

CIRCUIT ANALYZER FOR MEASURING PULSE REPETITION RATE AND PULSE WIDTH

This application is a continuation of applicant's prior co-pending application, Ser. No. 507,069, filed June 23, 1983, now abandoned.

BACKGROUND OF THE INVENTION

1. FIELD OF THE INVENTION

The field of technology with which the invention is concerned is digital logic testing apparatus. Such apparatus has utility in the construction of prototypes, production, maintenance and repair of digital circuits and electronic equipment such as computers, peripherals and control units.

2. DESCRIPTION OF THE RELATED ART

The capabilities of analog electric circuits are altogether different from the characteristics of the digital logic circuit testing apparatus constituting the invention, and applicant is unaware of any similar apparatus. The apparatus which is most closely related is the "Logic Tester" of Kokuyo Electric Co. in Japan, which only detects logic levels and positive and negative pulses. This equipment, however, does not automatically sense the floating logic level, count positive and negative pulses, measure any range of pulse widths, or perform other testing operations which can be performed with the apparatus of the invention.

SUMMARY OF THE INVENTION

An object of the invention is to provide digital logic circuit testing apparatus which is simple to construct, low-cost, portable, handy, reliable and capable of measuring pulse widths over a wide range from seconds to nanoseconds, including positive and negative pulses, and which can be controlled by means of positive and negative external control signals. The apparatus is also capable of measuring positive or negative pulse widths belonging to a burst and of counting positive or negative pulses or pulse bursts, being so controlled by means of positive or negative external signals, and of counting up to 999 pulses.

The novel apparatus provides readily available means for counting pulses. It simplifies the repair, maintenance and check-out procedures for digital electronic circuits; i.e., the operation of peripherals, digital computers, control units and other equipment that operates on the basis of digital techniques, because it provides real-time observation of the electronic processes which are occurring in a dynamic state. This has not been possible with prior logic testers, because they do not provide functional analysis of the electronic logic which is taking place. Such logic involves processes which depend on a definite number of pulses in data transfer, i.e., magnetic disk control units, floppy-disk controllers and card readers, to give only a few examples. The new apparatus provides automatic sensing of several logic levels(0, 1, floating or third state), by means of three light indicators and permits detection of negative and positive pulses controlled by positive and negative external control signals. It also detects voltages of 110 V/220 V AC, and has a lamp that can be used when illumination is inadequate. The present apparatus is capable of detecting and indicating the existence of continuity between two points of a circuit or wiring by providing a visual or audible signal. It has different interchangeable probes for measurements of integrated circuits and circuit contacts on prototype breadboards, as well as other applications.

The apparatus is capable of generating squarewave signals at selected frequencies, as well as positive and negative pulses for external use. It also can re-set its own counting circuits.

BRIEF DESCRIPTION OF THE DRAWING

The sole FIGURE is the drawing is a block circuit diagram of a digital logic testing circuit in accordance with the invention.

DESCRIPTION OF THE PREFERRED EMBODIMENTS

Referring to the drawing, block 1 is a 10 MHz crystal oscillator which is connected to one or more pulse counting integrated circuits comprised in block 2 and which serve as frequency dividers. Squarewave forms of different periods are obtained at the output of each counter in frequency divider 2, the frequency of each counter step being lower than the preceding counter step. A wide frequency range can be obtained since each counter has four outputs and there may be four counters, thus providing up to sixteen frequencies plus the oscillator frequency. In a particular design of the apparatus four frequencies were selected, ranging from 10 MHz for the highest and 150 Hz for the lowest. Frequency divider 2 is connected to a multiplex switch 3 comprising interrupters which allow the selection of any one of the four generated frequencies. This is achieved by means of micro-switches S1 to S4 located on the exterior surface of the complete testing apparatus. The appropriate frequency is selected according to the anticipated pulse width to be measured. If the count indicator 8 is not incremented that signifies that a higher frequency should be selected, and if it shows the maximum count of 999 that a lower frequency should be selected.

At the output of multiplex switch 3 at terminal P, there is produced a squarewave external signal in any of the four frequency ranges. This signal is also applied as clock pulses to the control logic block 6, where the number of pulses that will trigger a counter 7 are controlled. A selector block 4 permits selection of the polarity of the pulses of a signal X which are to be measured or counted, allowing such signal pulses to pass via control logic block 6 to counter 7. Selection of pulse width measurement or pulse counting is achieved by two alternative channels from selector 4. This selection is made by four micro-switches (S5–S8) which are accessible on the exterior surface of the apparatus. One channel of selector 4 is connected to the control logic block 6 where the pulses of the X signal to be counted or the number of clock pulses from multiplexer 3 are controlled when pulse width is to be measured. If pulse counting of the X signal is desired, the pulses go from selector 4 directly to control logic 6 and thence to counter 7 and the count is displayed on numeric display 8. For measurement of the pulse width of a signal X, the output of selector 4 is switched to a pulse sampling block 5, which is a circuit capable of sampling a pulse within a burst when the input X signal is a pulse burst rather than an isolated pulse. The output of pulse sampler 5 is connected to control logic block 6, which controls the passing of the number of clock pulses generated by the selected frequency produced by the multiplexor 3 during the time interval of the pulse width. This is obtained because the trailing edge of the pulse to be measured inhibits the clock entrance to control logic block 6. The circuit of pulse sampler 5 employs high-speed integrated circuits in order to minimize the transit time of the signal.

Since the input of clock pulses to control logic block 6 is inhibited by the signal coming from pulse sampler 5, the output of block 6 will be a number of clock pulses determined by the time duration of the pulse width being measured. The output of control logic block 6 is connected to counter block 7, which is a circuit formed from three integrated decimal counters, so that counter 7 only counts the number of clock pulses contained in the time interval of the pulse being measured or can be further limited by an external control signal from a source 16, which, for convenience, can reduce the duration of the signal being measured. Counter 7 preferably has a maximum count up to 999 pulses.

While counter 7 is counting the number of pulses, the count appears in numeric display 8. When counting stops, the last value in numeric display 8 remains stationary. If that value is then multiplied by the time base corresponding to the frequency selected in multiplexor 3, the result will be a measurement of the pulse width or time duration of the signal. An end-of-count detector block 9 is coupled to counter 7 and comprises three flip-flops that go to the "1" state when there is the highest count in counter 7, generating a decimal point in numeric display 8 when the value 999 has been obtained. This inhibits counter 7, preventing it from beginning a new count. The X signal, which may be a pulse or a burst of pulses signifying different logic levels, is applied to selector block 4 for the measurement of pulse width or for counting, and is also applied to a three-level sensor block 10, a transition detector block 13 and a continuity detector block 14.

Block 10 comprises a sensor circuit which senses the logic states(0, 1, floating or third state) of the received input X signal, and is connected to a multiplexor block 12. Multiplexor 12 comprises an integrated circuit switch for selecting the sensed logic level of the input pulse and is connected to the output block 11 which includes output circuits for displaying the logic states(0, 1, floating or third state) on visual indicators A, B and C.

The X signal is also applied to a transition detector block 13 comprising serially connected circuits which are responsive to external control signals supplied from block 16. Transition detector 13 can be constructed of D type flip-flops in order to minimize the number of states created by level transitions from 0 to 1 and from 1 to 0 which are conveyed to multiplexor 12 and displayed by the visual indicators A and C.

The input X signal is also applied to one input of a continuity detector block 14, the function of which is to measure continuity between two points of a circuit, and the other input terminal($\Omega$/R) of which is coupled to one of such circuit points. The other circuit point is the source of the X signal. Continuity detector 14 includes a switch for selecting between measuring circuit continuity or creating initial conditions(RESETS) in the other circuits of the apparatus. When detection of continuity between two points of a circuit or wiring is desired, it may be signified by an audible sound signal from continuity detector 14, which is self-powered by a small 1.5 V battery. It is also possible to provide visual indication of circuit continuity, because continuity detector 14 is connected to the input of logic level sensor 10. The condition of continuity between two points of a circuit can be observed on visual indicators A and C.

When continuity detector 14 is to be used to create initial conditions in the circuits of the apparatus, a clearing signal is introduced through its input contact($\Omega$/R), block 14 including a switch which may be set to a re-set position. The external signal is passed to a pulse generator in block 15 when it is desired to provide the effect of a buffer circuit by use of a signal which is stronger than the signals applied to the other circuits in the apparatus. In pulse generator 15 there exists a return switch that allows the user to manually create initial conditions and a schmitt trigger circuit to eliminate noise.

The external signals S and $\bar{S}$ are generated by pulse generator 15. They are negative and positive pulses which may be used for circuit testing and logic functions, and in self-testing the functions of the apparatus by connecting the outputs S and $\bar{S}$ to the measurement point where the X signal is applied.

The complete testing apparatus requires an operating voltage of only five volts and has been assembled with MSI integrated circuits. It has good coupling between power supply and ground reference, and thereby free of noise.

Besides its economic advantages, it can generally be employed as a substitute for more expensive measurement equipment of large size such as oscillscopes and multimeters. In addition, it performs functions which cannot be accomplished by such equipment.

While the invention has been described with reference to certain preferred embodiments thereof, it will be evident to those skilled in the art that various modifications and adaptations thereof may be made without departing from the true spirit and scope of the invention as defined in the succeeding claims.

I claim:

1. A circuit analyzer comprising:
   an input terminal;
   a pulse counter (7);
   clock means (1,2,3) for generating clock pulses to serve as a time base for said pulse counter;
   logic gating means (6) coupled between said counter and said clock means and responsive to an input pulse signal on said input terminal from a circuit being analyzed by said analyzer for applying said clock pulses to said counter, said logic gating means being responsive to the leading edge of said input pulse signal appearing at a first control terminal thereof to convey said clock pulses to said counter and being responsive to the trailing edge of said input pulse signal appearing at said frist control terminal to block said clock pulses from said counter, whereby the number of clock pulses received by said counter is a measure of the width of said input pulse signal; said logic gating means further being adapted to convey a clock pulse from said clock means to said counter in response to each input pulse signal appearinig at a second control terminal thereof, whereby the counter measures the number of said iput pulse signals;
   pulse signal appearing at a second control terminal thereof signal selecting means coupled to said input terminal of said circuit analyzer and having first and second output terminals for selectively providing said pulse signal on either of said first and second output terminals, said first output terminal being coupled to the second control terminal of said logic gating means; and
   pulse sampling means (5) coupled between the second output terminal of said pulse selecting means and the first control terminal of said logic gating means for selecting a single input pulse signal from a pulse burst comprisinig a sequence of input pulse signals and applying said selected input pulse signal to said logic gating means, said selected pulse signal causing said logic gating means to convey clock pulses to said counter during the duration of said selected pulse signal, whereby the number of clock pulses so conveyed to said counter signify the width of said selected pulse signal.

2. An analyzer according to claim 1 wherein said clock means includes an oscillator, means for dividing a frequency of said oscillator to provide a set of time bases; and
a multiplex switch for selecting one of said time bases.

3. An analyzer according to claim 1 further comprising logic level sensing means (10,11,12) coupled to said first-mentioned input terminal of said analyzer for providing a visual indication of transitions in the logic levels of signals received from the circuit being analyzed.

4. An analyzer according to claim 3 wherein
said clock means includes an oscillator (1) and means (2) for dividing down the frequency of said oscillator to provide a set of time bases, said clock means further comprising a multiplex switch (3) for selecting one of said time bases for said counter (7).

* * * * *